(12) United States Patent
Yu

(10) Patent No.: US 7,413,470 B1
(45) Date of Patent: Aug. 19, 2008

(54) MODULAR ASSEMBLY OF MEMORY MODULE PACKAGES

(75) Inventor: Hong-Chi Yu, Kaohsiung (TW)

(73) Assignee: Walton Advanced Engineering, Inc., Kaohsiung (TW)

( * ) Notice: Subject to any disclaimer, the term of this patent is extended or adjusted under 35 U.S.C. 154(b) by 0 days.

(21) Appl. No.: 11/727,415

(22) Filed: Mar. 26, 2007

(51) Int. Cl.
*H01R 11/00* (2006.01)
(52) U.S. Cl. .......................... 439/502; 439/37; 439/640
(58) Field of Classification Search ................. 439/502, 439/37, 638, 640
See application file for complete search history.

(56) References Cited

U.S. PATENT DOCUMENTS 7,300,306 B2 * 11/2007 Le et al. .................... 439/502

* cited by examiner

Primary Examiner—Javaid Nasri
(74) Attorney, Agent, or Firm—Troxell Law Office, PLLC

(57) ABSTRACT

A modular linking assembly of memory module packages primarily comprises a plurality of memory module components and at least a flexible connector. A plurality of USB contact fingers and a plurality of expanding fingers are formed on two opposing sides of the outer surface on each memory module component. The flexible connector has a first casing, a second casing and a plastic elastomer connecting the first casing to the second casing. The first casing has a plurality of first connecting terminals for electrically contacting the expanding fingers. The second casing has a plurality of second connecting terminals for electrically contacting the USB contact fingers. The plastic elastomer has a plurality of conductive wiring electrically connecting the first terminals to the second terminals so that the connected memory module components are electrically connected to each other to increase readable memory capacities with only one USB slot. Moreover, the connected memory module components can be flexible to be connected into a decorative chain for personal carrying such as a necklace, a bracelet or an anklet. In another embodiment, at least one of the memory module components can be replaced with a dummy component.

6 Claims, 6 Drawing Sheets

MODULAR ASSEMBLY OF MEMORY MODULE PACKAGES

FIELD OF THE INVENTION

The present invention relates to a decorative chain having portable semiconductor devices, especially, to a modular linking assembly having a plurality of semiconductor memory module packages.

BACKGROUND OF THE INVENTION

A USB thumb drive with built-in memory devices is very popular nowadays. Almost everyone has at least one of them. As it is well known that the prices per unit memory capacity of thumb drives are dropping dramatically and the memory capacities can not be changed nor expanded when you purchase it. A USB slot, for example, only can accept one thumb drive. If you have several thumb drives, either you have to swap them or you have to buy a multiple-port USB unit. Furthermore, the dimension of the thumb drive is getting smaller and smaller. It can easily get lost.

SUMMARY OF THE INVENTION

The main purpose of the present invention is to provide a modular linking assembly with electrical and mechanical connections between a plurality of memory module packages. The modular linking assembly has a flexible connector with both ends connecting to memory module packages. Therefore, the memory module packages can be connected as many as possible for being readable and writable for one USB slot without swapping between the memory module packages nor using multiple-port USB units. Moreover, the memory module packages can be connected into a decorative chain for personal carrying such as a necklace, a bracelet or an anklet.

According to the present invention, a modular linking assembly of memory module packages primarily comprises a plurality of memory module components and at least a flexible connector. Each memory module component includes a substrate, at least a memory chip, and an encapsulant where the substrate has an inner surface, an outer surface, a plurality of USB contact fingers and a plurality of expanding fingers where the USB contact fingers and the expanding fingers are formed on two opposing sides of the outer surface. The memory chip is disposed on the inner surface of the substrate and is electrically connected to the USB contact fingers. The encapsulant is formed on the inner surface of the substrate to encapsulate the memory chip. The flexible connector has a first casing, a second casing and a plastic elastomer flexibly connecting the first casing and the second casing. The first casing has a plurality of first connecting terminals and the second casing the second connecting terminals. The plastic elastomer has a plurality of conductive wiring electrically connecting the first connecting terminals with the second connecting terminals. The first casing is configured for mechanically connecting one end of a memory module component so that the first connecting terminals electrically contact the expanding fingers of the corresponding memory module component. The second casing is configured for mechanically connecting the other end of another memory module component so that the second connecting terminals electrically contact the USB contact fingers of the corresponding memory module component. Eventually, both memory module packages are electrically and flexibly connected to each other through the flexible connector. In another embodiment, at least a dummy component having no electrical transmission can be replaced with one of the memory module components.

DETAIL DESCRIPTION OF THE INVENTION

Please refer to the attached drawings, the present invention will be described by means of embodiment(s) below.

Figure 1A:
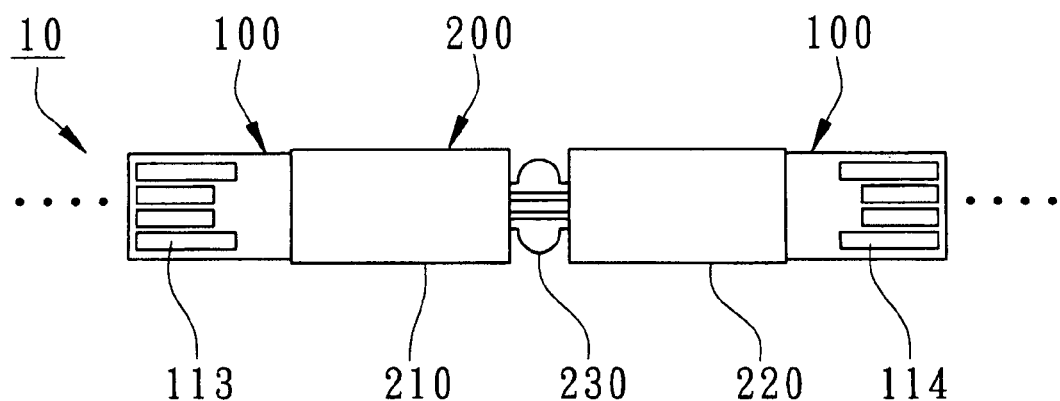
FIGS. 1A and 1B show a top view and a cross-sectional view of a modular linking assembly of memory module packages according to the preferred embodiment of the present invention.
Figure 1B:
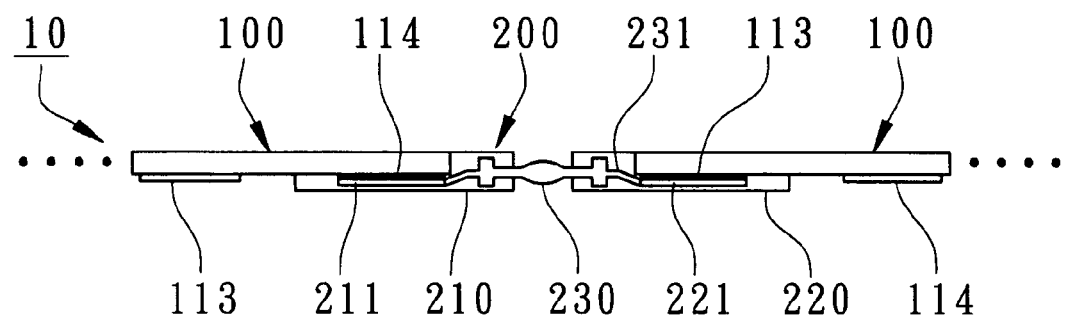

According to the first embodiment of the present invention, as shown in FIG. 1A and FIG. 1B, a modular linking assembly 10 of memory module packages mainly comprises a plurality of memory module components 100 and at least a flexible connector 200 where both ends of the flexible connector 100 can flexibly connect two memory module components 100 and the memory module components 200 can be electrically connected to each other as many as possible.

Figure 2A:
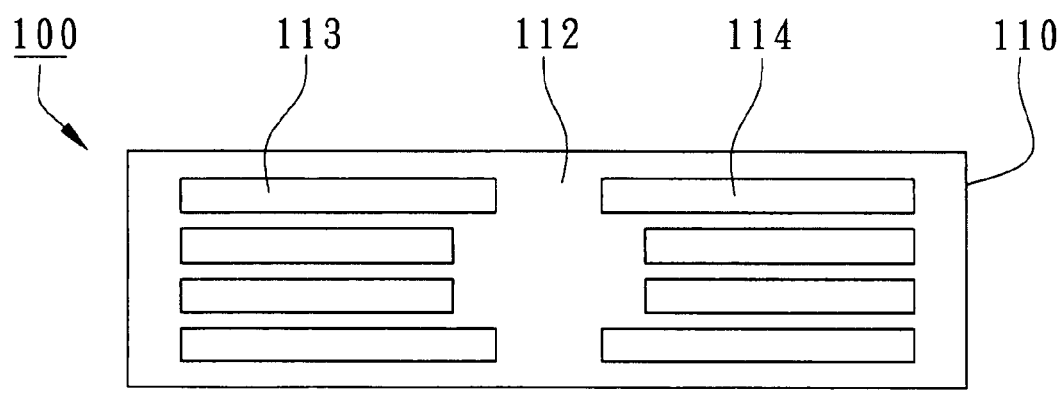
FIGS. 2A and 2B show a top view and a cross-sectional view of a memory module component from the modular linking assembly according to the preferred embodiment of the present invention.
Figure 2B:
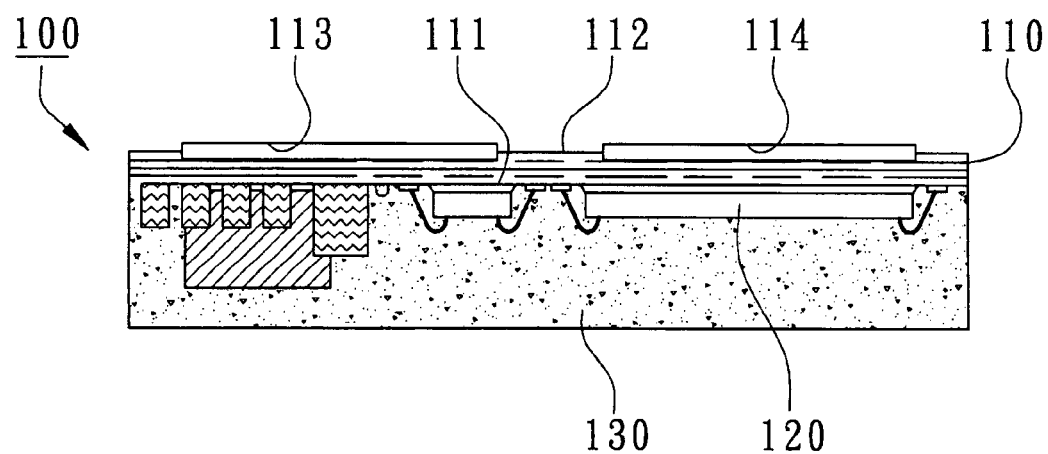

As shown in FIG. 2A and FIG. 2B, each memory module component 100 comprises a substrate 110, at least a memory chip 120 and an encapsulant 130 where the substrate 110 has an inner surface 111 and an outer surface 112. Normally the substrate 110 is a doubt-sided printed circuit board where a plurality of USB contact fingers 113 and a plurality of expanding fingers 114 are formed on two sides of the outer surface 112. The USB contact fingers 113 can plug into any device with a USB slot having four terminals. The expanding fingers 114 are inversely configured and are electrically connected to the USB contact fingers 113 of another memory module component 100. Normally, the expanding fingers 114 and the USB contact fingers 113 may look the same.

The memory chip 120 is disposed on the inner surface 111 of the substrate 110 and is electrically connected to the USB contact fingers 113. In the present embodiment, the memory chip 120 is a flash memory which stored data will not be lost when there is no power. Moreover, the memory chip 120 is electrically connected to the substrate 110 by bonding wires. Passive components and/or controllers can be disposed on the inner surface 111 of the substrate 110.

The encapsulant 130 is formed on the inner surface 111 of the substrate 110 to encapsulate the memory chip 120. In the present embodiment, the encapsulant 130 can be formed by transfer molding so that the outline of the memory module component 100 can be very small such as a small brick.

Figure 3A:
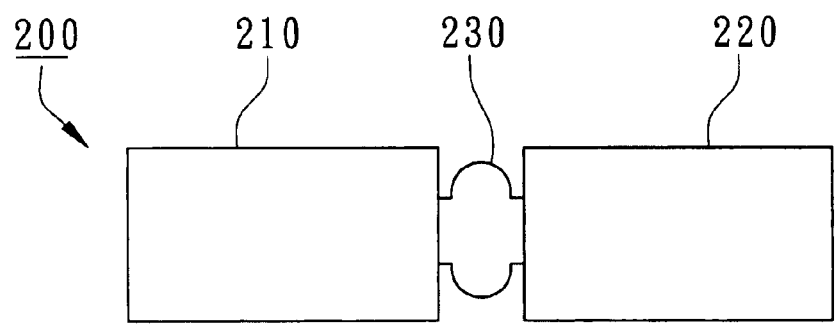
FIGS. 3A, 3B and 3C show a top view, a cross-sectional view parallel to the top surface, and another cross-sectional view perpendicular to the top surface of a flexible connector from the modular linking assembly according to the preferred embodiment of the present invention.
Figure 3B:
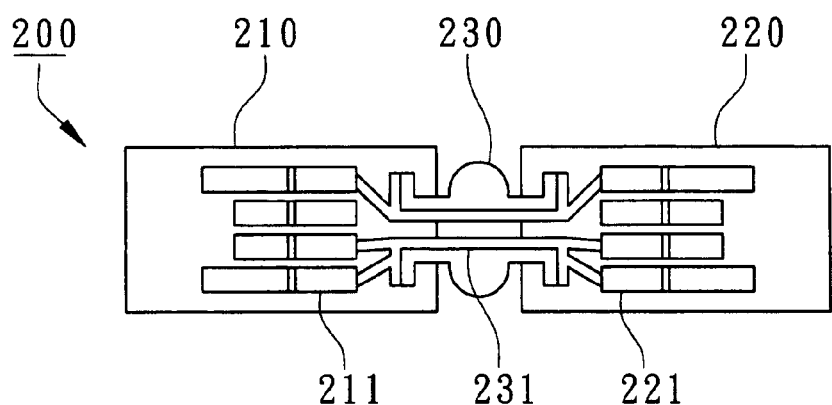
Figure 3C:
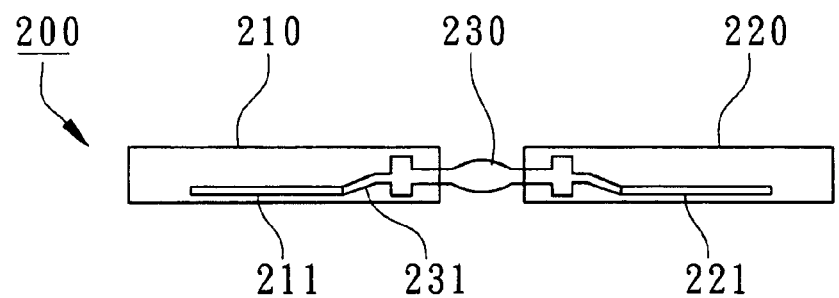

As shown in FIGS. 3A, 3B, and 3C, the plastic connector 200 has a first casing 210, a second casing 220 and a plastic elastomer 230 mechanically and electrically connecting the first casing 210 to the second casing 220. The first casing 210 has a plurality of first connecting terminals 211 to electrically connect to the expanding fingers 114 of one of the memory module components 100. The second casing 220 has a plurality of second connecting terminals 221 to electrically connect to the USB contact fingers 113 of another memory module component 100. The plastic connector 200 further has a plurality of conductive wiring 231 passing through the plastic elastomer 230 to electrically connect the first connecting terminals 211 to the second connecting terminals 221. As shown in FIG. 1B, when the first casing 210 is mechanically connected to one end of memory module component 100 with the expanding fingers 114, the first terminals 211 electrically contact the expanding fingers 114. When the second casing 220 is mechanically connected to one end of another memory module component 100 with the USB contact fingers 113, the second connecting terminals 221 electrically contact the USB contact fingers 113. Accordingly, the two connected memory module components 100 by the plastic elastomer 230 are electrically connected to each other.

Figure 4A:
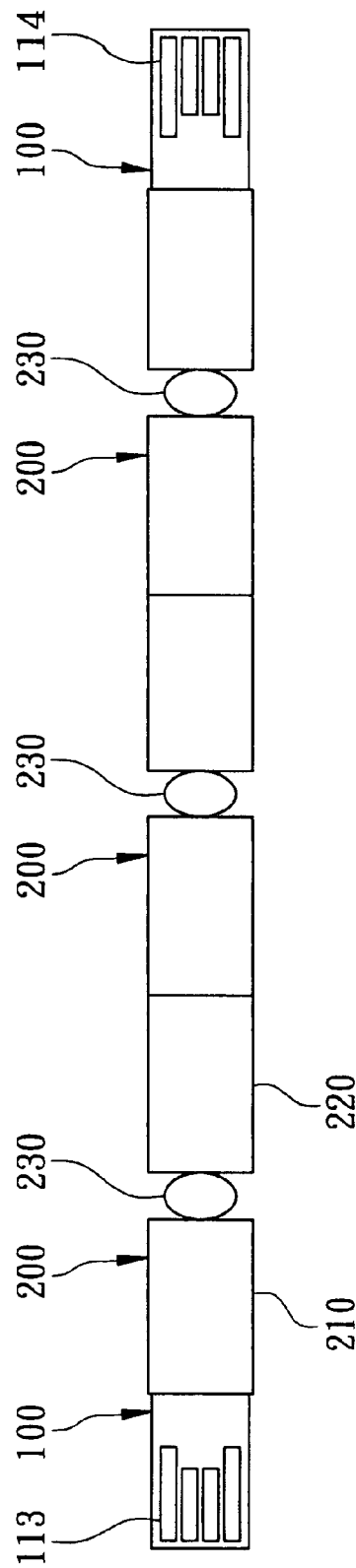
FIGS. 4A and 4B illustrate the flexibility of the modular linking assembly on a plane parallel to the top surface according to the preferred embodiment of the present invention.
Figure 4B:
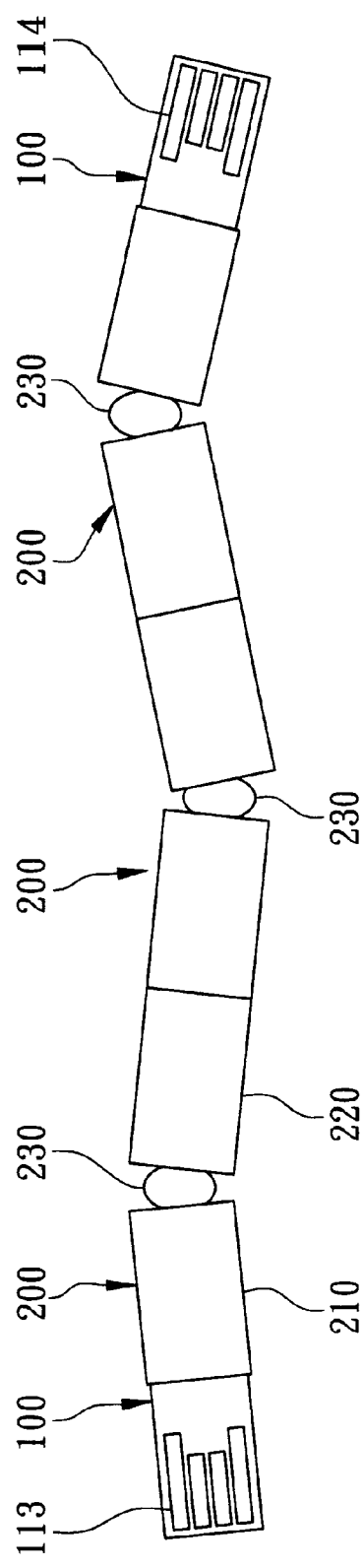
Figure 5A:
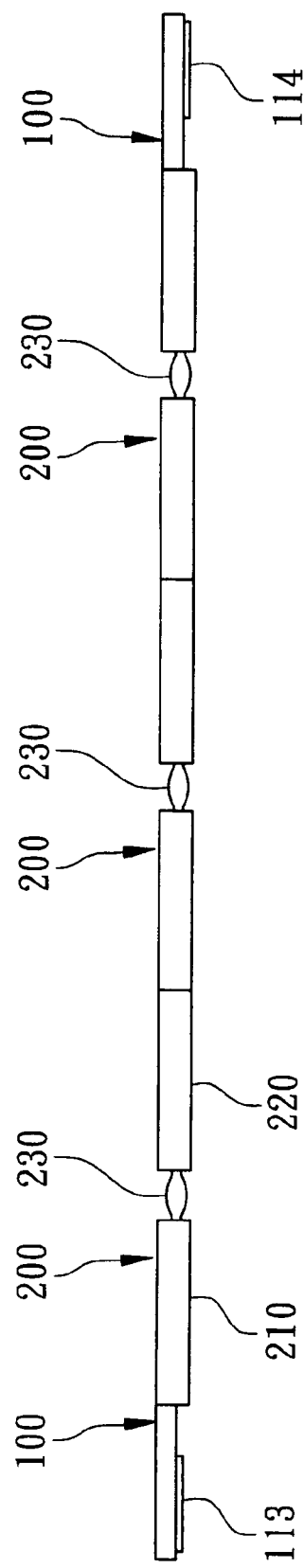
FIGS. 5A and 5B show illustrate the flexibility of the modular linking assembly on a plane perpendicular to the top surface according to the preferred embodiment of the present invention.
Figure 5B:
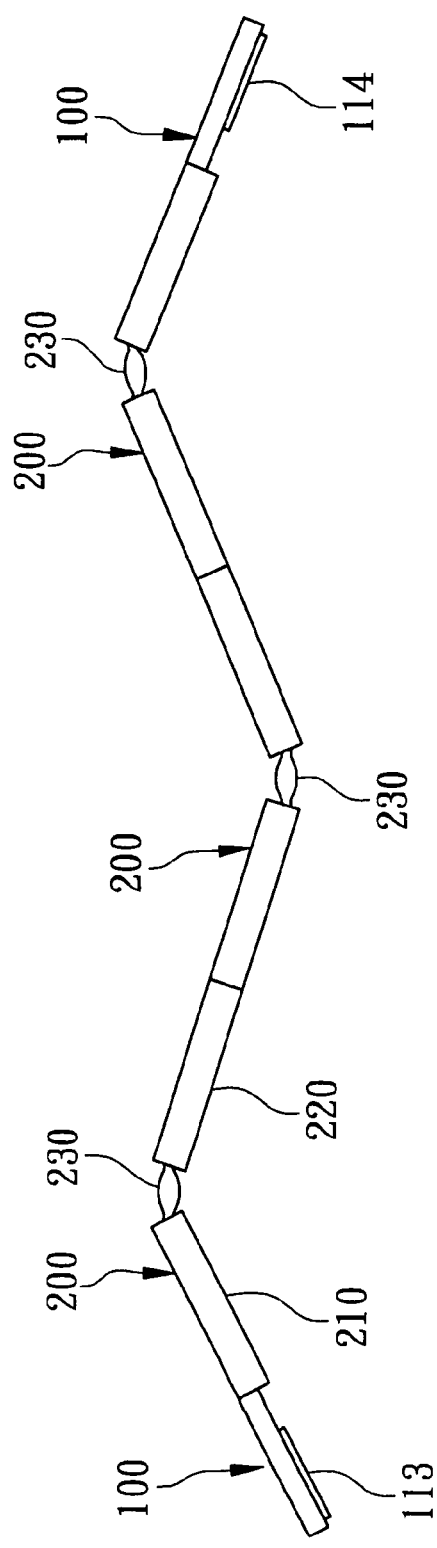

One of the applications of the memory module components 100 is shown in FIG. 4A and FIG. 5A, by increasing the number of flexible connectors 200, more memory module components 100 can be electrically connected to one another. Moreover, by plugging the USB contact fingers 113 on one exposed side of the first memory module component 100 into a USB slot in a desktop computer or a notebook computer, the USB contact fingers 113 of the first memory module component 100 will be electrically connected to the terminals of the USB connector, then all the connected memory module components 100 can be shown on the operation system of a desktop computer or a notebook computer, then stored data in all the connected memory module components 100 can be read and written. As shown in FIG. 4B and FIG. 5B, the plastic elastomer 230 of the flexible connector 200 allow the connected memory module components 100 to be flexible between each other without causing the first memory module component under extra loadings to break.

The memory module components 100 can be mechanically connected to as many memory module components as possible by increase the quantity of the flexible connectors 200.

Figure 6:
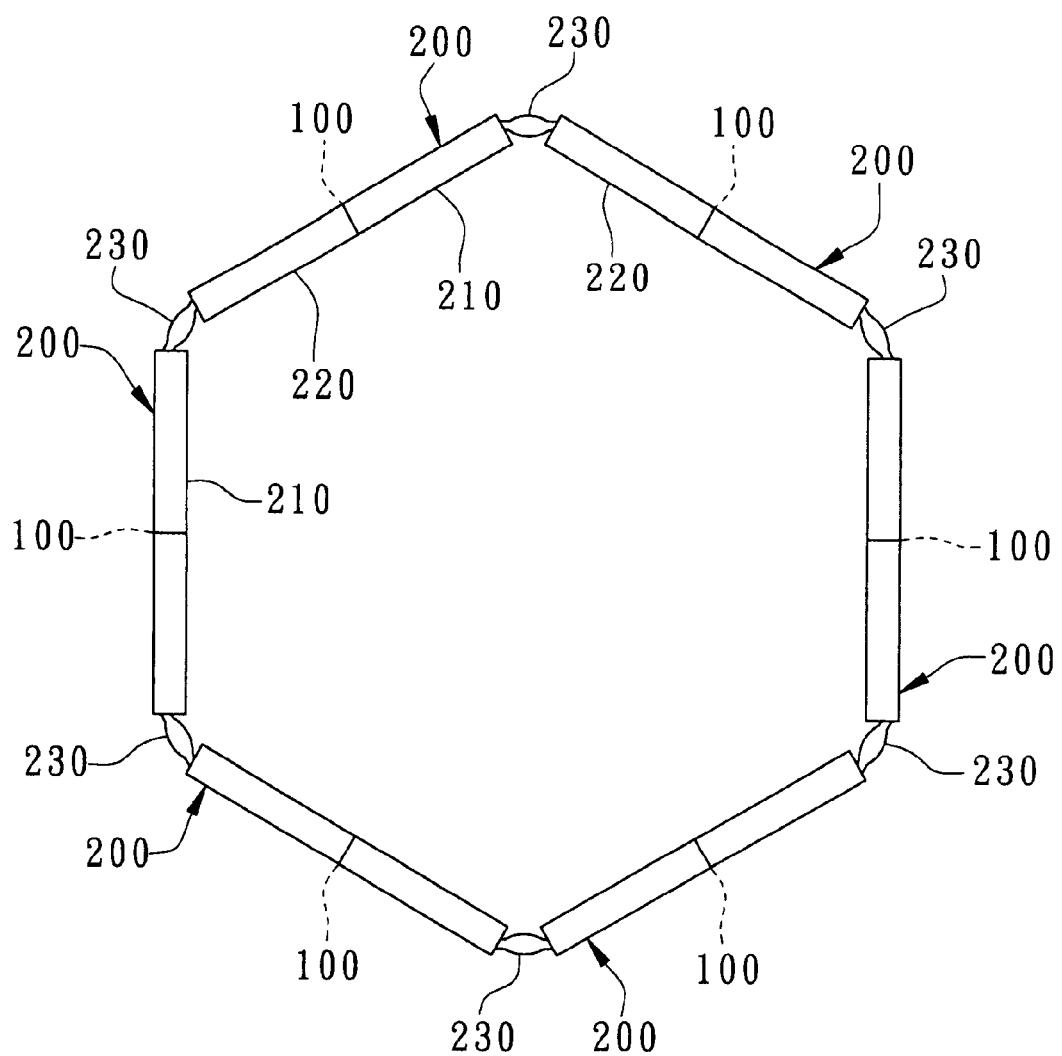
FIG. 6 shows a side view of the modular linking assembly linked as a decorative chain according to the preferred embodiment of the present invention.

Another application of the memory module components 100 is shown in FIG. 6 where the number of the flexible connector 200 can be the same as the one of the memory module components 100. By the plastic elastomer 230, the modular linking assembly 10 can be linked as a decorative chain for personal carrying such as a necklace, a bracelet or an anklet. Both ends of the memory module components 100 are mechanically connected with the first casing 210 at one end and the second casing 220 at the other end by two flexible connectors 200. Preferably, the memory module components 100 are embedded inside two connecting flexible connectors 200 to have better protection. In another embodiment, at least one of the memory module components 100 can be replaced with a dummy component having no electrical transmission, where the dummy component has a dimension the same as the memory module component 100 such that two ends of the dummy component is mechanically connected by the flexible connectors 200.

The above description of embodiments of this invention is intended to be illustrative and not limiting. Other embodiments of this invention will be obvious to those skilled in the art in view of the above disclosure.

What is claimed is:

1. A modular linking assembly comprising:
   a plurality of memory module components, each including a substrate, at least a memory chip and an encapsulant, wherein the substrate has an inner surface and an outer surface, a plurality of USB contact fingers and a plurality of expanding fingers formed on two opposing sides of the outer surface, wherein the memory chip is disposed on the inner surface and is electrically connected to the USB contact fingers, wherein the encapsulant is formed on the inner surface of the substrate to encapsulate the memory chip; and
   at least a flexible connector having a first casing, a second casing and a plastic elastomer connecting the first casing and the second casing; wherein the first casing has a plurality of first connecting terminals and the second casing have a plurality of second connecting terminals; wherein the plastic elastomer has a plurality of conductive wiring electrically connecting the first connecting terminals with the second connecting terminals;
   when the first casing is mechanically connected to one end of one of the memory module components with the expanding fingers, the first connecting terminals electrically contact the expanding fingers;
   when the second casing is mechanically connected to one end of another one of the memory module components with the USB contact fingers, the second connecting terminals electrically contact the USB contact fingers so that the connected memory module components are electrically connected and are mechanically flexible to each other by the flexible connector.

2. The modular linking assembly of claim 1, wherein the number of the flexible connectors is the same as the one of the memory module components to link the memory module components as a decorative chain.

3. The modular linking assembly of claim 1, wherein at least one of the memory module components has two ends connected by a plurality of flexible connectors such that the memory module component is completely embedded.

4. A modular linking assembly comprising:
   a memory module component including a substrate, at least a memory chip and an encapsulant, wherein the substrate has an inner surface and an outer surface, a plurality of USB contact fingers and a plurality of expanding fingers formed on two opposing sides of the outer surface, wherein the memory chip is disposed on the inner surface and is electrically connected to the USB contact fingers, wherein the encapsulant is formed on the inner surface of the substrate to encapsulate the memory chip;
   a plurality of flexible connectors, each having a first casing, a second casing and a plastic elastomer connecting the first casing and the second casing; wherein the first casing has a plurality of first connecting terminals and the second casing have a plurality of second connecting terminal; wherein the plastic elastomer has a plurality of conductive wiring electrically connecting the first connecting terminals with the second connecting terminals; and
   a dummy component having a dimension the same as the memory module component such that two ends of the dummy component is mechanically connected by the flexible connectors;

when one of the first casings is mechanically connected to one end of the memory module component with the expanding fingers, the first connecting terminals electrically contact the expanding fingers;

when one of the second casings is mechanically connected to the other end of the memory module components with the USB contact fingers, the second connecting terminals electrically contact the USB contact fingers.

5. The modular linking assembly of claim 4, wherein the number of the memory module components and the dummy components is the same as the one of the flexible connectors to link as a decorative chain.

6. The modular linking assembly of claim 4, wherein the memory module component and the dummy component are completely embedded inside the flexible connectors.

* * * * *